(12) United States Patent
Dawson et al.

(10) Patent No.: US 8,472,271 B2
(45) Date of Patent: Jun. 25, 2013

(54) SYSTEMS AND METHODS FOR MEMORY DEVICE PRECHARGING

(75) Inventors: James W. Dawson, Poughkeepsie, NY (US); Rajiv V. Joshi, Yorktown Heights, NY (US); Noam Jungmann, Holon (IL); Elazar Kachir, Tel Aviv (IL); Rouwaida N. Kanj, Round Rock, TX (US); Ehud Nir, Hod Hasharon (IL); Donald W. Plass, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 152 days.

(21) Appl. No.: 13/030,341

(22) Filed: Feb. 18, 2011

(65) Prior Publication Data

US 2012/0213023 A1    Aug. 23, 2012

(51) Int. Cl.
*G11C 7/00* (2006.01)

(52) U.S. Cl.
USPC ........... 365/203; 365/204; 365/205; 365/206; 365/207

(58) Field of Classification Search
USPC .................... 365/203, 204, 205, 206, 207
See application file for complete search history.

(56) References Cited

U.S. PATENT DOCUMENTS

| | | | |
|---|---|---|---|
| 5,870,346 A | 2/1999 | Komarek et al. | |
| 6,160,746 A | 12/2000 | Park et al. | |
| 6,549,450 B1 | 4/2003 | Hsu et al. | |
| 7,623,377 B2 | 11/2009 | Lee et al. | |
| 7,629,145 B2 | 12/2009 | Lee et al. | |
| 7,652,941 B2* | 1/2010 | Mori et al. | 365/203 |
| 7,751,267 B2 | 7/2010 | Joshi et al. | |
| 8,009,494 B2* | 8/2011 | Chang | 365/203 |
| 2007/0064479 A1* | 3/2007 | Yamada | 365/185.2 |
| 2008/0186776 A1 | 8/2008 | Kim et al. | |
| 2009/0316464 A1 | 12/2009 | Sharma et al. | |
| 2009/0316465 A1 | 12/2009 | Jain et al. | |
| 2010/0091576 A1 | 4/2010 | Kwon et al. | |
| 2010/0182860 A1* | 7/2010 | Chang | 365/203 |
| 2012/0069636 A1* | 3/2012 | Pelley et al. | 365/154 |

OTHER PUBLICATIONS

Raiter, K. R., and Cockburn, B. F., "Auto-calibration technique for on-chip reference voltage generation in ferroelectric memories", Electrical and Computer Engineering. 2005, pp. 702-705, Canadian Conference on Digital Object Identifier, Saskatoon, Saskatchewan, May 1-4, 2005.

* cited by examiner

*Primary Examiner* — Pho M Luu
(74) *Attorney, Agent, or Firm* — Ference & Associates LLC

(57) ABSTRACT

Systems and methods for determining optimal memory device precharge voltages are provided herein. In addition, systems and methods for providing localized sense amplification and circuit assist circuitry are described herein. Embodiments provide for determining precharge multipliers that may be used to determine the optimal precharge voltage based on a precharge source voltage. According to embodiments, the precharge source voltage may be Vdd or Vcs. Optimizing the precharge voltage maximizes memory device performance and functional characteristics, including, but not limited to, stability, efficiency, power, writability, and reliability.

25 Claims, 16 Drawing Sheets

SYSTEMS AND METHODS FOR MEMORY DEVICE PRECHARGING

BACKGROUND

The field of the invention involves the pre-charging of memory devices. Static Random Access Memory (SRAM) is a type of semiconductor memory device used in a wide array of electronic devices, most prominently in critical, smaller applications, such as CPU and hard drive caches. Data is stored in SRAM memory statically. As such, dynamic updating is not required as in other memory devices, most notably Dynamic Random Access Memory (DRAM) devices. However, SRAM is volatile memory wherein data is only retained as long as power is supplied to the memory circuit. In addition, SRAM is a form of random access memory, meaning that memory locations may be written to or read from the device in any order independent of previous memory accesses.

In general, an SRAM memory cell consists of a set of transistors configured as cross-coupled inverters or flip-flops. For example, bits may be stored on four transistors that form two cross-coupled inverters. Additional access transistors may be present to control cell access during read and write operations. SRAM memory circuits utilize wordlines for controlling access to bit lines used for transferring data during read and write operations. The two bit lines are often referred to as BL and $\overline{BL}$, or the true bit line and the complement bit line. The SRAM configuration has two stable states, equating to logical "0" and "1" states. The stability of the SRAM memory circuit may be enhanced by pre-charging the bit lines. Conventionally, the bit lines are precharged to the supply voltage with limited effect on memory stability, efficiency and performance.

BRIEF SUMMARY

In summary, one aspect of the invention provides an apparatus comprising: one or more memory devices; one or more memory cells arranged in rows and columns within the one or more memory devices, the one or more memory cells comprising: one or more wordlines configured to activate one or more rows of memory cells; and one or more bit lines configured to transfer memory cell data, the one or more bit lines configured to receive a precharge voltage; and one or more voltage supplies supplying one or more voltages to the one or more memory cells, wherein at least one of the one or more voltage supplies is a precharge voltage source; wherein the one or more bit lines are precharged with the precharge voltage, the precharge voltage being determined by multiplying a voltage supplied by the precharge voltage source by a precharge multiplier optimized for the one or more memory cells.

Another aspect of the invention provides a method comprising: arranging one or more memory cells in rows and columns within a semiconductor memory device, the one or more memory cells comprising: one or more wordlines configured to activate one or more rows of memory cells; and one or more bit lines configured to transfer memory cell data, the one or more bit lines configured to receive a precharge voltage; and supplying the one or more memory cells with one or more voltages through one or more voltage supplies, wherein at least one of the one or more voltage supplies is a precharge voltage source; wherein the one or more bit lines are precharged with the precharge voltage, the precharge voltage being determined by multiplying a voltage supplied by the precharge voltage source by a precharge multiplier optimized for the one or more memory cells.

A further aspect of the invention provides an apparatus comprising: one or more memory devices; one or more memory cells arranged in rows and columns within the one or more memory devices, the one or more memory cells comprising: one or more wordlines configured to activate one or more rows of memory cells; and one or more bit lines configured to transfer memory cell data, the one or more bit lines comprising one or more local bit lines and one or more global bit lines; one or more circuit assist circuits; and one or more sense amplification circuits; wherein the one or more bit lines are precharged with a precharge voltage determined by multiplying a voltage supplied by the precharge voltage source by a precharge multiplier optimized for the one or more memory cells; wherein the one or more sense amplification circuits and the one or more circuit assist circuits are operably coupled to the one or more local bit lines.

The foregoing is a summary. For a better understanding of example embodiments, together with other and further features and advantages thereof, reference is made to the following description, taken in conjunction with the accompanying drawings, and the scope of the invention will be pointed out in the appended claims.

DETAILED DESCRIPTION

Figure 1:
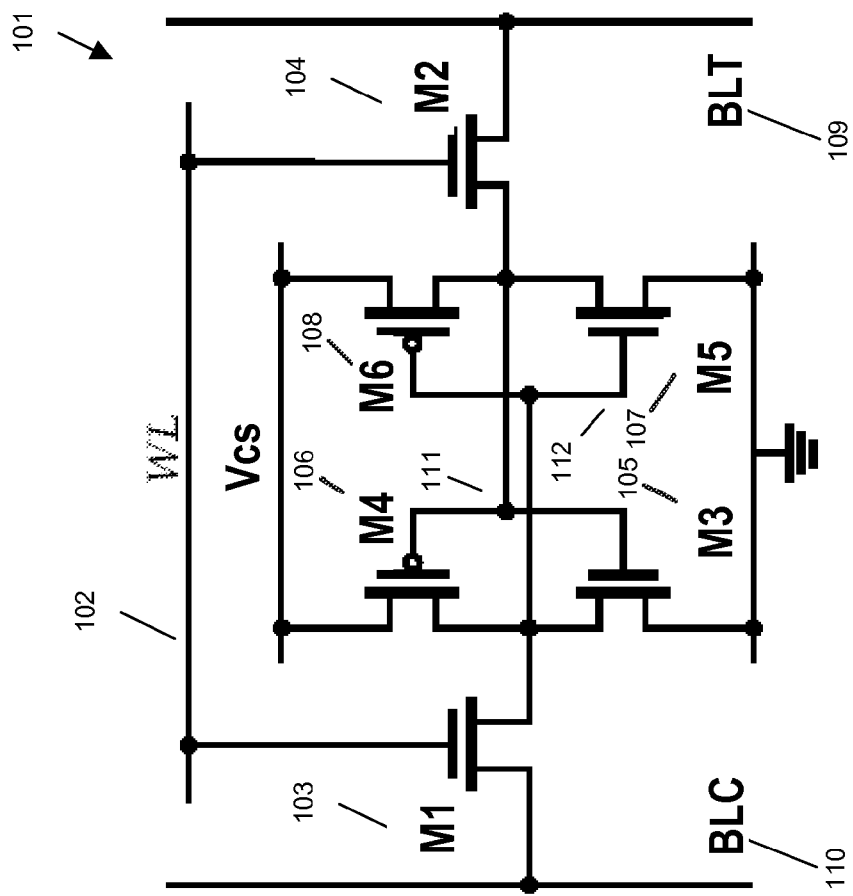
FIG. 1 illustrates an example six transistor SRAM memory cell.

It will be readily understood that components of the embodiments, as generally described and illustrated in the figures herein, may be arranged and designed in a wide variety of different configurations in addition to the described example embodiments. Thus, the following more detailed description of embodiments, as represented in the figures, is not intended to limit the scope of the invention, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, appearances of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that various embodiments can be practiced without one or more of the specific details, or with other methods, components, materials, et cetera. In other instances, well-known structures, materials, or operations are not shown or described in detail to avoid obfuscation. Throughout this description, example embodiments are described in connection with a computer, such as a desktop, laptop, or notebook computer; however, those skilled in the art will recognize that certain embodiments are equally applicable to other types of electronic devices.

Memory efficiency is a function of the number of memory cells per area of a memory device. Conventional memory devices are comprised of a limited, smaller number of cells per area. According to existing technology, increasing the number of memory cells may improve efficiency, however, it also leads to a loss of stability and performance. As such, potential exists for improving memory device stability, performance and efficiency.

Conventional memory devices are comprised of memory arrays consisting of rows and columns of memory cells with wordlines for accessing selected rows through access transistors (i.e. transmission gates) and bit lines for accessing selected columns. In general, during a read or write operation, one row is active responsive to the activation of its corresponding wordline. However, not all columns in the row are activated. As such, when the wordline is on and the column is selected, a cell is defined as a "selected cell," and when the wordline is on and the column is off, a cell is defined as a "half-selected cell." During normal memory operation, such as during a read or write cycle, one cell in the row is selected and the remaining cells are half-selected.

The precharging of memory devices is essential to ensure proper operation and to enhance device stability. In general, precharging operates to set and equalize the voltage of the memory device bit lines. Typically, precharging is accomplished through a precharge circuit that is connected to the bit lines. The precharge is deactivated during the evaluation phase when the wordline turns on (i.e., during read/write operations). Conventional technology provides for setting the precharge voltage to the cell supply voltage, the logic supply voltage, or some similar value. However, such precharge voltages may not optimize the efficiency, stability and performance characteristics of a memory device.

Accordingly, embodiments described herein provide for the optimization of the precharge voltage to maximize memory device stability, efficiency, and performance while optimizing overall cell power. Embodiments provide for cell read simulations based on precharge voltage sweeps to maximize memory cell performance. As a non-limiting example, simulations may involve transient simulations of a memory cell and determining the effect on one or more cell characteristics, such as stability or performance. In addition, embodiments may analyze memory device statistics for optimal precharge voltage to meet overall yield based circuit requirements, including, but not limited to, performance, stability and power. Furthermore, embodiments may determine a lower and upper bound of precharge voltages for optimal cell functionality. Accordingly, when the optimal precharge voltage is utilized for a memory device, efficiency, as a function of memory cells per area, may be increased because the memory device is more stable and, thus, more able to handle additional memory cells.

Referring now to FIG. 1, therein is depicted an example of a six transistor SRAM memory cell, often referred to as a 6T cell. The memory cell 101 is capable of storing one bit of information in the form of logical "1" or "0." A wordline (WL) 102 controls access to transistors M1 103 and M2 104 which control whether the memory cell 101 is connected to the true bit line (BLT) 109 and the complement bit line (BLC) 110. Transistors M1 103 and M2 104 may also be called "transmission gates" or "pass transistors" and are often NMOS transistors. Transistors M3 105 and M4 106 form a first inverter 111, and transistors M5 107 and M6 108 form a second inverter 112. Each inverter is often comprised of one PMOS transistor and one NMOS transistor, however, other transistors and combinations of transistors may be used. The first inverter 111 and the second inverter 112 are cross-coupled to each other.

In general, the memory cell has four possible states: standby, half-select, reading, and writing. In standby mode, the wordline 102 is not asserted (i.e., logical "0") and the access transistors M1 103 and M2 104 disconnect the bit lines 109, 110 from the memory cell 101. The information in the first and second inverters 111, 112 is preserved as long as sufficient power is supplied to the memory cell 101.

In half-select mode, the cell column is not selected. However, the wordline 102 is asserted (logical "1") and the access transistors M1 103 and M2 104 connect the bit lines 109, 110 to the memory cell 101. The bitlines BLT 109 and BLC 110 that are precharged to logical "1" may inject charge onto the cell nodes.

A read operation starts with the pre-charging of BLT 109 and BLC 110 to logical "1." The access transistors M1 103 and M2 104 are enabled after the wordline 102 is driven high (i.e., logical "1"). If logical "1" is stored in the memory cell 101, BLT 109 is driven to logical "1" while BLC 110 is driven to logical "0." On the other hand, if the memory cell 101 were storing logical "0," BLT 109 would be driven to logical "0" and BLC 110 would be driven to logical "1." Circuitry not shown in FIG. 1 detects which of BLT 109 and BLC 110 has a higher voltage and, ultimately, whether the memory cell 101 was storing a logical "1" or "0."

During a write operation, the value to be written is applied to BLT 109 and its complement is applied to BLT 110. The wordline 102 is driven high, enabling the access transistors M1 103 and M2 104. The value to be written is then stored in the memory cell 101.

Figure 2:
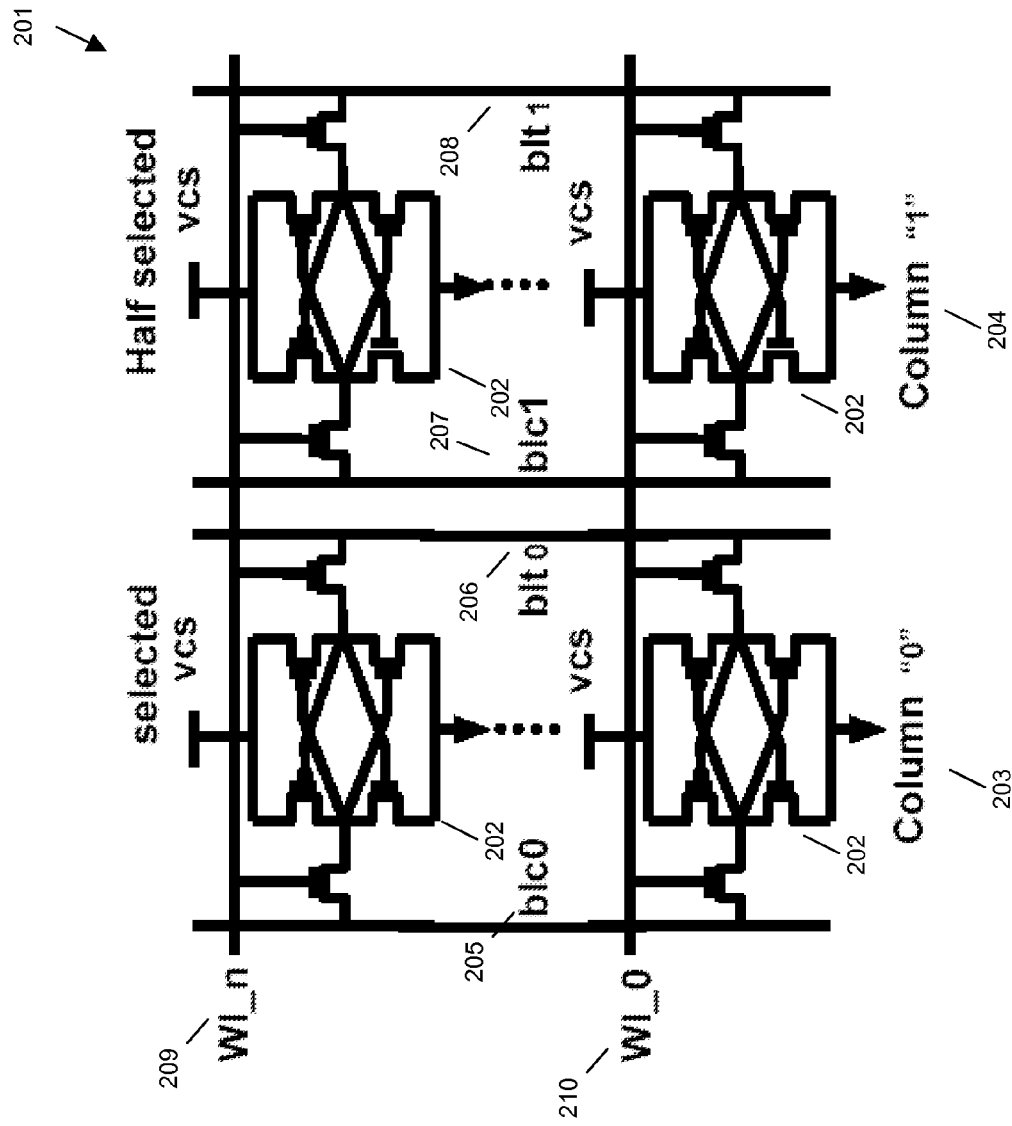
FIG. 2 illustrates an example array of SRAM memory cells with selected and half-selected cells.

Referring to FIG. 2, therein is depicted an example array of SRAM memory cells with selected and half-selected cells. The SRAM memory cell array 201 is comprised of memory cells 202 arranged in two columns, column "0" 203 and column "1" 204. However, SRAM memory arrays may have more or less columns than the configuration depicted in FIG. 2. Column "0" 203 has bit lines blc0 205 and blt0 206, and column "1" 204 has bit lines blc1 207 and blt1 208. Wordlines WL_n 209 and WL__0 210 control whether the bit lines 205-208 are connected to the memory cells 202. If WL__0 210 is on then the cell defined by column"0" 203 and WL__0 210 is selected, and the cell defined by column"1" 204 and WL__0 210 is said to be in 'half-select' mode. The Vcs label refers to the array-cell specific voltage. This is opposed to the array being connected to the logic supply, Vdd, which may make it susceptible to loss of memory cell stability. An array specific supply may be assigned, as in FIG. 2, to improve cell stability and performance.

Figure 3:
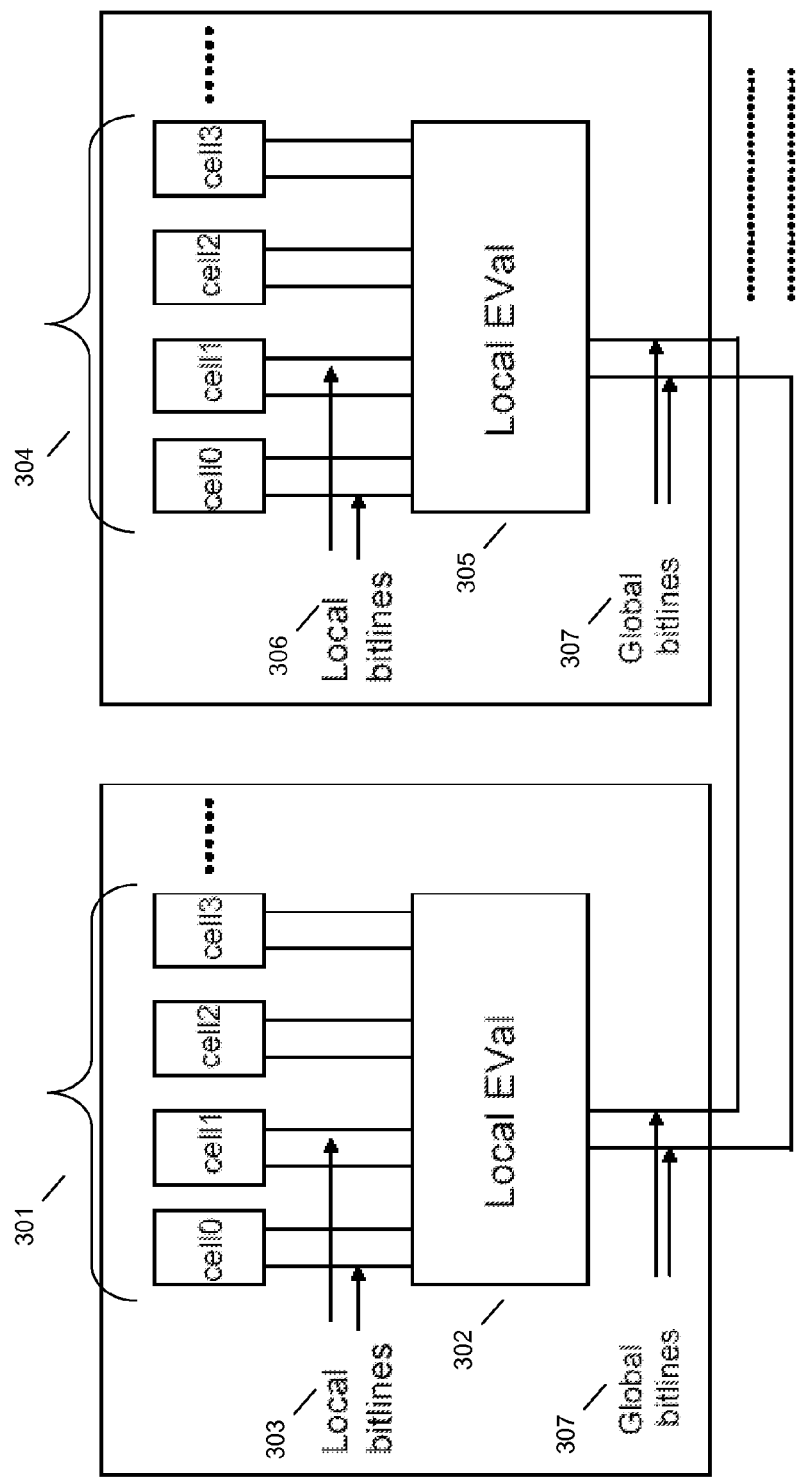
FIG. 3 illustrates a block diagram of an example memory device array.

FIG. 3 provides a high-level block diagram of an example memory device array. A first group of cells 301 is connected to a first Local Eval 302 circuitry arrangement through a first set of local bit lines 303. In general, Local Eval circuitry evaluates the local bit lines and is designed to condition data written to and read from a group of SRAM cells in an array. In addition, a second group of cells 304 is connected to a second Local Eval 305 circuitry arrangement through a second set of local bit lines 306. The first and second set of local bit lines 303, 306 are common to a pair of global bit lines 307.

Figure 4:
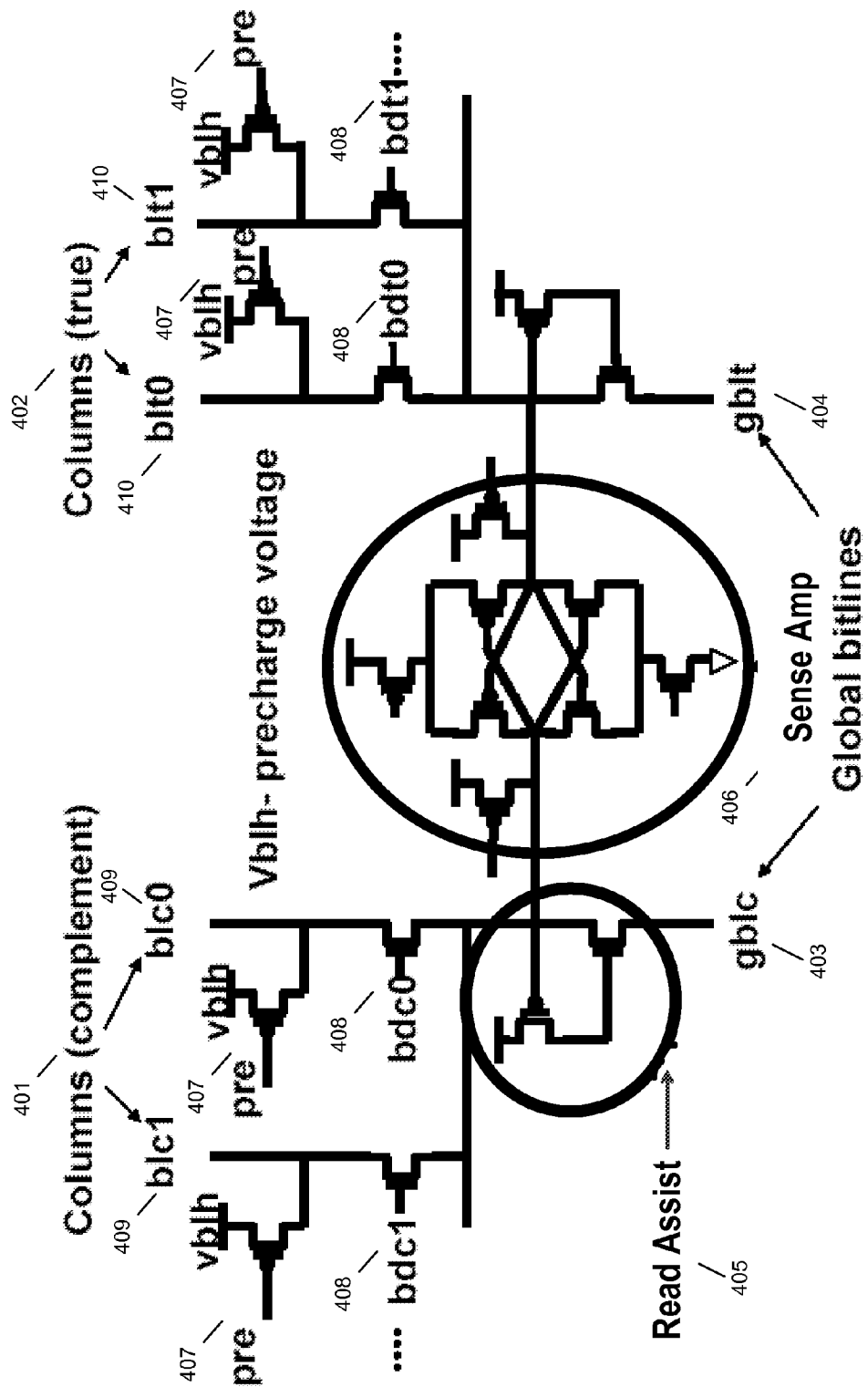
FIG. 4 illustrates an example Local Eval circuitry arrangement with precharge and sense amplification circuitry.

An example Local Eval circuitry arrangement, featuring Read Assist and Sense Amp circuitry, is illustrated in FIG. 4. Bit line complement 401 and bit line true 402 columns are connected through global bit line complement 403 and global bit line true 404, respectively, to Read Assist 405 and Sense Amp 406 circuitry. The Vblh voltages 407 are bit line high voltages, which are the memory device precharging voltages in the example circuitry depicted in FIG. 4. The precharge signals 407 restore the local bit lines to the programmed precharge voltage. Column selection is determined by column select transistors 408. In the example memory device provided in FIG. 4, the column select transistors 408 are bdc0 and bdc1 for the complement bit lines 409 (blc0 and blc1) and bdt0 and bdt1 for the true bit lines 410 (blt0 and blt1).

The Read Assist 405 and Sense Amp 406 circuitry are configured to increase the performance and stability of the memory device. In general, the Sense Amp 406 obtains the data stored in the memory array by amplifying small differential signals on the bit lines in order to minimize corruption of charges in a cell. As a non-limiting example, an SRAM memory device comprised of a large array of cells may experience a read operation with a low voltage. To overcome the low voltage, the Sense Amp 406 amplifies voltages coming from the true and complement bit lines. The Sense Amp 406 is only activated when its corresponding column is activated. Accordingly, the Sense Amp 406 works on selected cells and not on half-selected cells. The Read Assist 405 circuit attempts to enhance the performance of the design by further amplifying the voltage differential on the bitlines thereby pulling up the high voltage that is high and further pulling down the low voltage on the bit lines. It may also indirectly help the stability for the selected column case.

Figure 5:
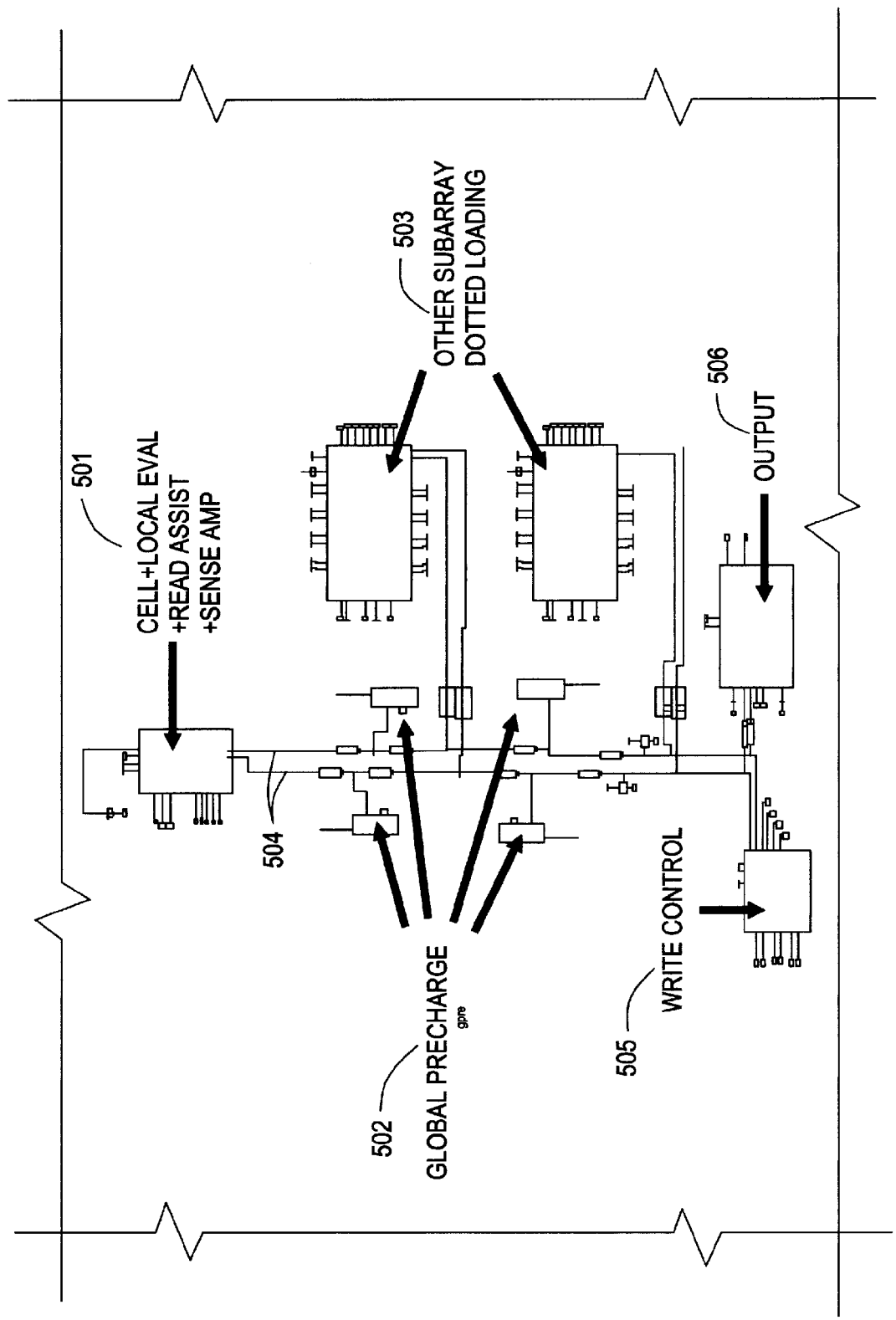
FIG. 5 illustrates a cross-section of an example memory device.

Referring to FIG. 5, therein is depicted a cross-section of a memory device. A memory cell 501 comprised of certain circuits, including, but not limited to, Local Eval, read assist, and sense amplification circuits is depicted. Global precharge 502 devices are configured to precharge elements of the memory device. The cross-section includes sub memory device sub arrays 503 for loading, which are tied into the global bit lines 504. The memory device of FIG. 5 is sense amplification circuit based and additionally includes write control 505 and output 506 circuits.

Memory cell bit lines have a capacitance that may be increased because there are a number of cells arranged together in a memory device. This charge may be dumped into the cell thereby causing instability. This occurs in cells in the half-selected state because memory assist circuits, such as a read assist circuit, and sense amp circuits are not available to assist the half-selected memory cell. Accordingly, embodiments provide for optimally precharging bitlines, which particularly helps half-selected cells to, inter alia, counter these destabilizing effects, while also improving the stability of selected cells.

According to embodiments, optimizing the precharge voltage enhances memory device stability. As such, memory device efficiency may be increased because more cells may be arranged on the bit lines. Embodiments provide that a certain percentage of the cell supply voltage in the form of a precharge voltage is provided to the cell to enhance stability. Statistical methodology according to embodiments is utilized to determine one or more optimum precharge voltages. This methodology may involve comparing selected and half selected cases, such as through bit line select signals (e.g., BDA). In addition, methodology according to embodiments may involve one or more memory cell stability and writability yield, precharge voltage, and model analyses. As a non-limiting example, the analyses may involve utilizing Super Fast Monte Carlo analysis, or some variation thereof. In addition, embodiments provide that the same methodology may be used for e-Dram and extended to other n-T cells (e.g., n=1, 2, 6, 8), or to other memory devices capable of operating under embodiments described herein. Furthermore, to improve performance, reliability circuits may be provided and/or circuit placement strategies may be employed.

Embodiments provide for the determination of a precharge multiplier value. The optimal precharge voltage may be determined according to embodiments by multiplying a source precharge voltage by a precharge multiplier. As a non-limiting example, if the source precharge voltage is 0.9 V and the precharge multiplier is 0.7, then the optimal precharge voltage may be equal to $0.9 \times 0.7 = 0.63$ V. According to embodiments, analysis of memory device characteristics, such as stability, under operating conditions may be utilized to determine the precharge multiplier.

The programming of the precharge voltages may be carried out using various appropriate methods and circuit configurations. As a non-limiting example, an analog circuit may be utilized to program the optimal precharge voltage. Another non-limiting example involves multi-Vt source follower NFETs with drains connected to the cell voltage supply.

According to existing technology, the precharge voltage is typically set at Vdd, or some closely related variant thereof, or is only based on a selected cell criterion. However, embodiments may determine an optimal precharge solution based on the weakest stability phenomena. Furthermore, embodiments may predict a lower and upper bound on yield-sensitive precharge voltage that is based on, inter alia, a statistical methodology. This is in contrast to conventional technology, which is based on limited simulations lacking crucial information, such as statistical yield information. In addition, embodiments provide for a methodology that is based on optimization of multiple memory device characteristics and functions, including, but not limited to, performance, writability, stability, efficiency, power, and reliability. Embodiments may optimize the precharge for one characteristic or by maintaining a balance between multiple characteristics. Furthermore, embodiments provide for functionality and timing predictions through yield. Moreover, embodiments may be configured to find an optimal precharge voltage for a maximum margin for a particular operation, such as a read operation.

Embodiments provide for programmable precharge multi-Vt source follower FETs for the precharging of local bit lines. FETs may include, but are not limited to, NFETs and PFETs. This is in contrast to existing methods that only provide a fixed precharge voltage of Vdd. According to embodiments, precharge tuning capabilities are provided that are sensitized to performance feed back. As a result, embodiments may provide for increased memory area efficiency without requiring additional voltage supplies.

Memory devices may take advantage of the increased stability provided by embodiments to increase the cell line count per bit line. In addition, embodiments provide for a complementary circuit that allows for improved performance, increased cell stability, or reduced variability effects.

According to embodiments, sense amplifier and circuit assist circuits, such as read assist or write assist circuits, may be used at smaller sub arrays. As a non-limiting example, these circuits may be arranged at local bit lines at the end of each sub array. This is in contrast to existing technology wherein sense amplifier and circuit assist circuits are utilized globally with a large number of cells per sense amplification and circuit assist circuit. In addition, the output of a sense amplification circuit according to embodiments may be a dotted OR. Furthermore, embodiments provide for muxed local bit lines, which may save memory device area and improve performance. Moreover, embodiments provide that a functionality failure of sense amplifier circuitry may be compensated by circuit assist circuitry, such as read assist circuitry.

Figure 6:
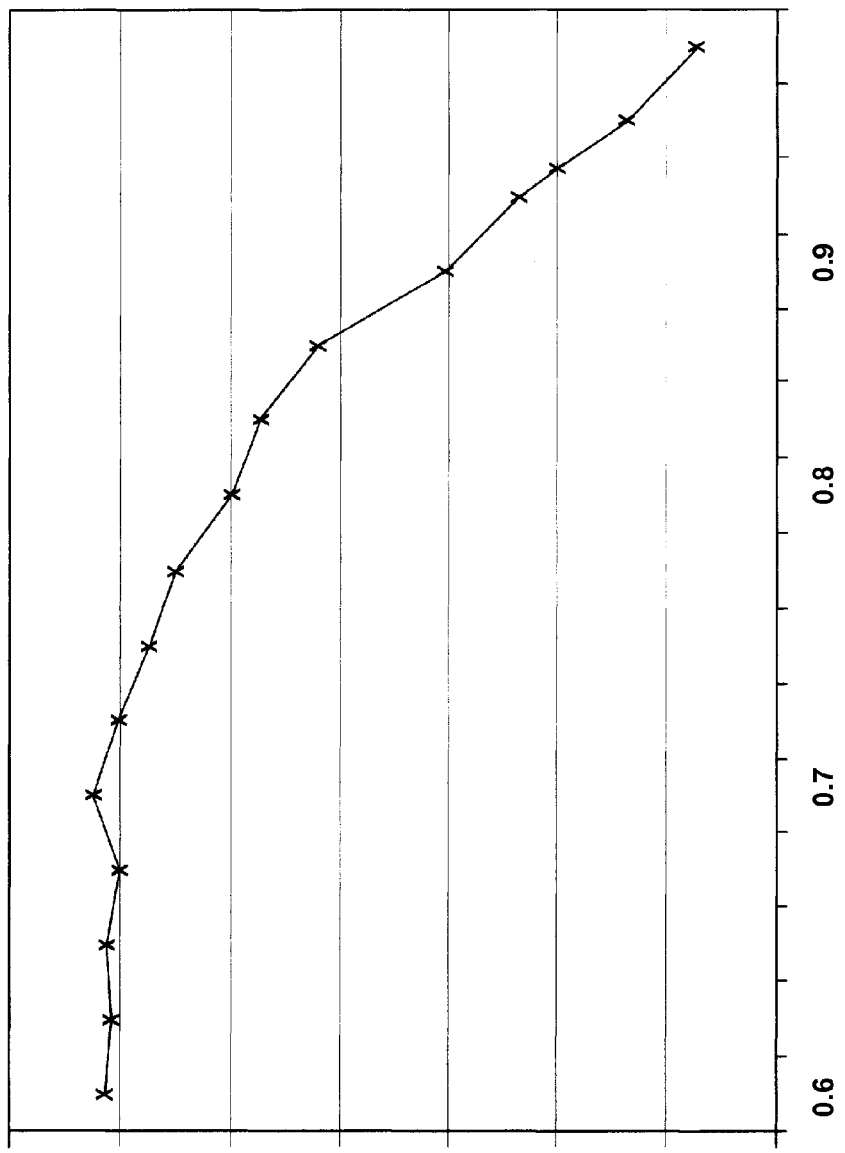
FIG. 6 provides a graph of sense amplification margins and precharge ratios.

FIG. 6 provides a graph of sense amplification margin over a range of precharge multipliers resulting from optimizing precharge voltage for performance. In this non-limiting example, the memory device is an SRAM memory device. Typically, the margin is determined as the differential that develops across the sense amplifier circuit during a read operation by the time the sense signal turns on. The higher the sense amplifier margin, the better the design. In this non-limiting example, the sense amp margin is determined for different precharge multiplier values subject to statistical timing conditions. The graph of FIG. 6 indicates, inter alia, that any precharge multiplier in the range of 0.6-0.725 may give an optimum margin. As such, embodiments provide that a margin higher than the minimum may be translated into a performance boost by, among other things, turning on the latch-based differential sense amp earlier. As a non-limiting example, a performance boost may be comprised of shorter cycle times.

Figure 7:
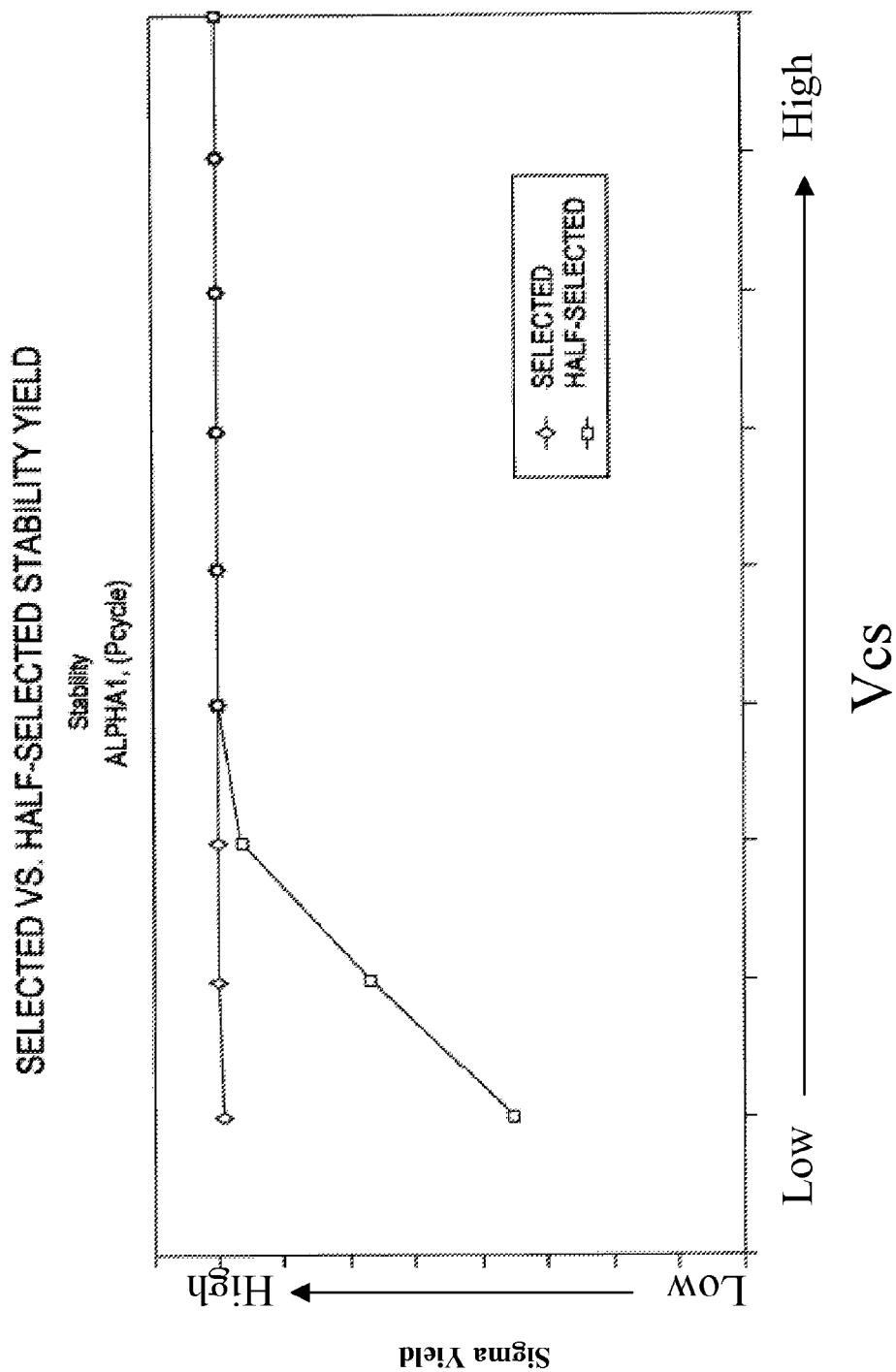
FIG. 7 provides a graph representing selected and half-selected stability yields.

Referring to FIG. 7, therein is depicted a graph representing selected and half-selected stability yields. In this figure and hereafter, Sigma is a measure of memory cell yield; larger values of sigma indicate a larger yield. As a non-limiting example, Sigma may be the minimum amount of equivalent total variation necessary to cause a failure, such as a read or write failure. As a non-limiting example, Sigma may be derived from the inverse Gaussian distribution based on the estimated probability of failure. In addition, memory device characteristics, including, but not limited to, stability, writability, reliability, efficiency, and performance, may be measured in terms of dynamic/static behavior translated to yield numbers. As mentioned above, the Vcs label of the x-axis refers to an array-cell specific voltage. Traditional logic supply voltage (Vdd) can cause the cells to be susceptible memory cell instability. As such, Vcs is typically introduced as an array cell specific voltage to increase cell stability and performance.

In the non-limiting example graphically depicted by FIG. 7, selected and half-selected components may be determined based on a circuit signal such as BDA. In such an example, BDA "on" indicates a selected cell, while BDA "off" indicates a half-selected cell. The graph depicted in FIG. 7 indicates a drop in yield for lower voltages and a precharge multiplier of 0.725.

Figure 8:
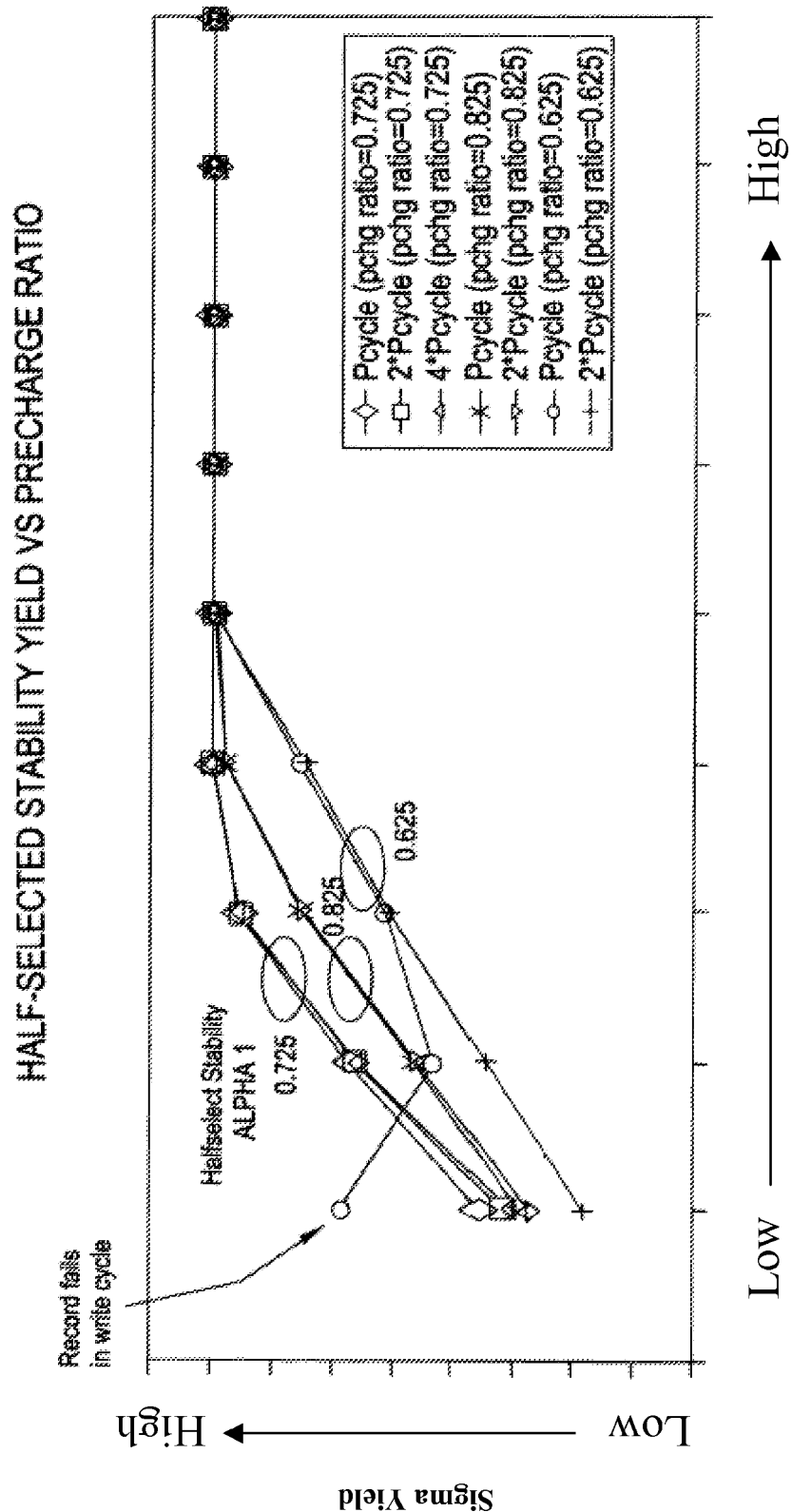
FIG. 8 provides a graph of half-selected stability yields and precharge ratios.
Figure 9:
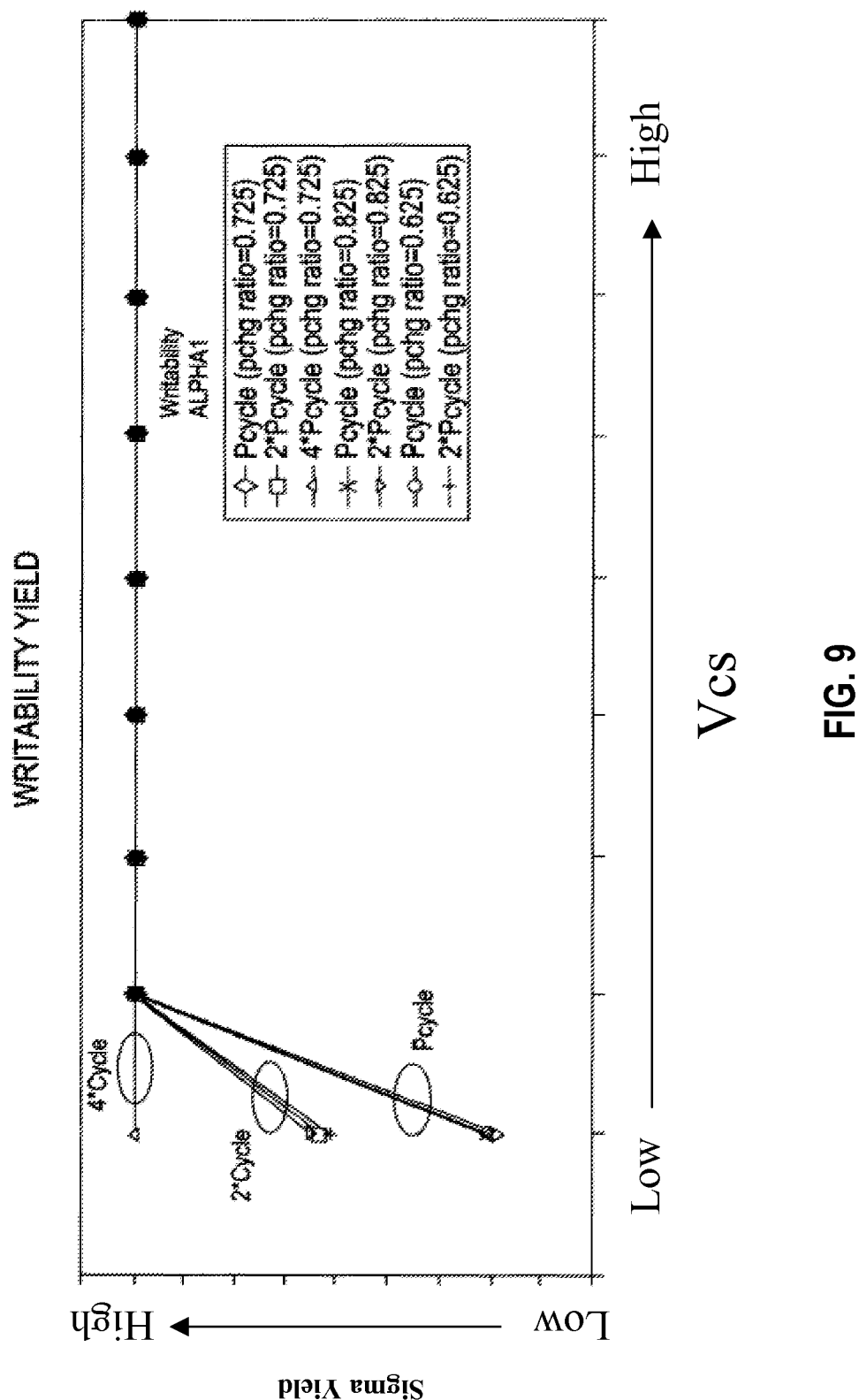
FIG. 9 provides a graph of memory device writability yields.

FIG. 8 provides a graph involving half-selected stability yield and precharge ratio. In this graph, different precharge multiplier values were analyzed in terms of their impact on yield. A mid-range value of 0.725 was found to be optimal. Pcycle is the traditionally designated cycle time. This non-limiting example also involved increased cycle time analysis. Alpha1 represent a given technology target model node. In addition, a graph involving Alpha1 and memory device writability yield is provided in FIG. 9.

Figure 10:
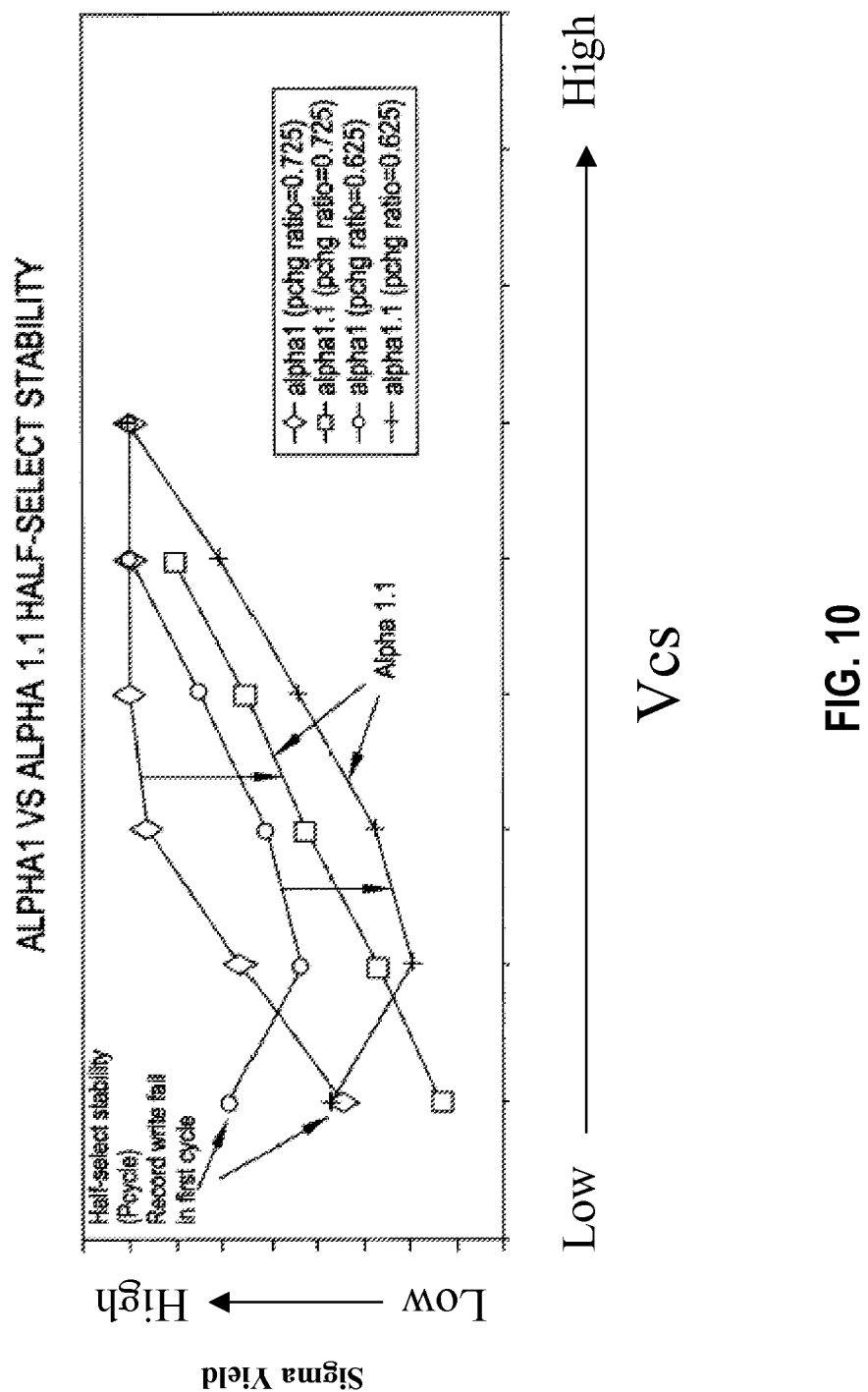
FIG. 10 illustrates half-selected stability as a function of Sigma yield and array-cell specific voltage (Vcs).
Figure 11:
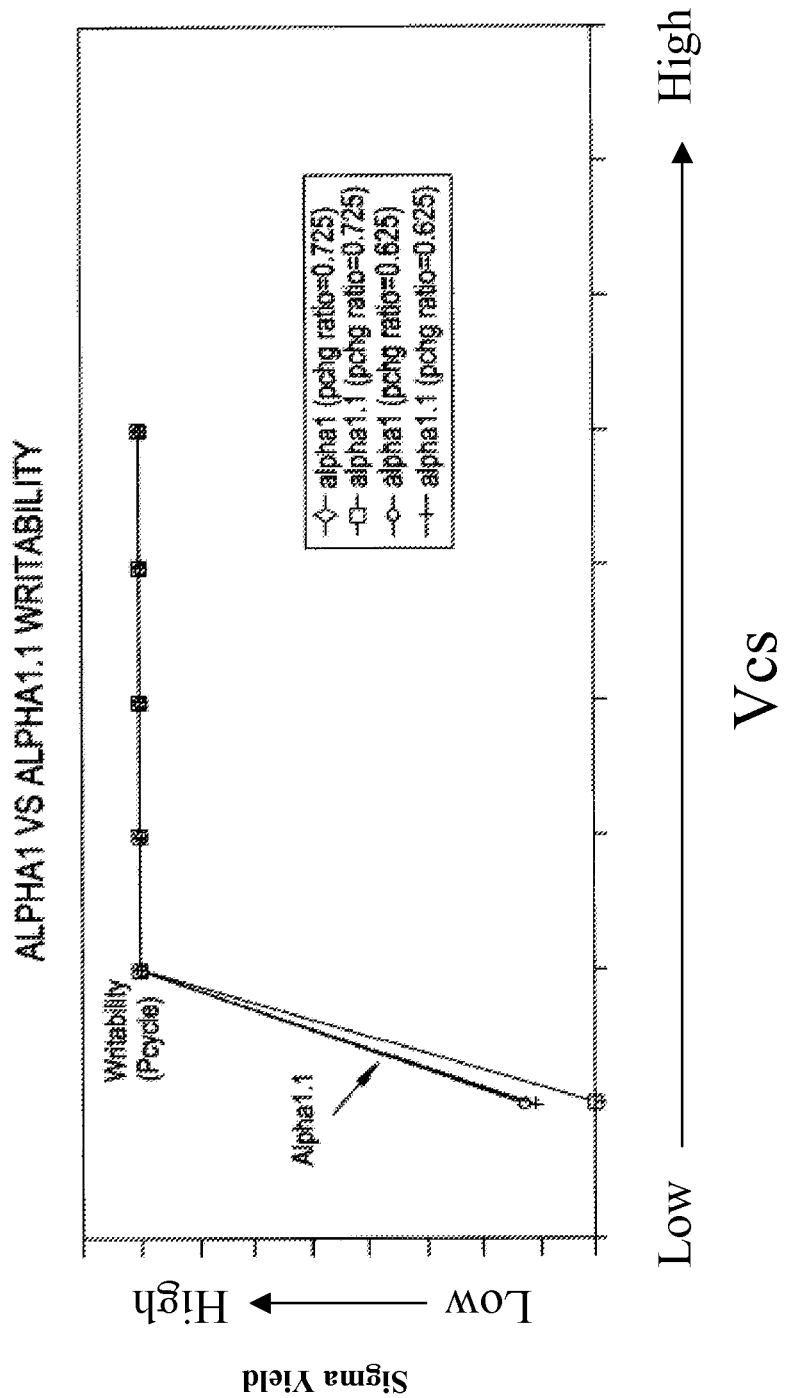
FIG. 11 provides a graph of writability as a function of Sigma yield and Vcs.
Figure 12:
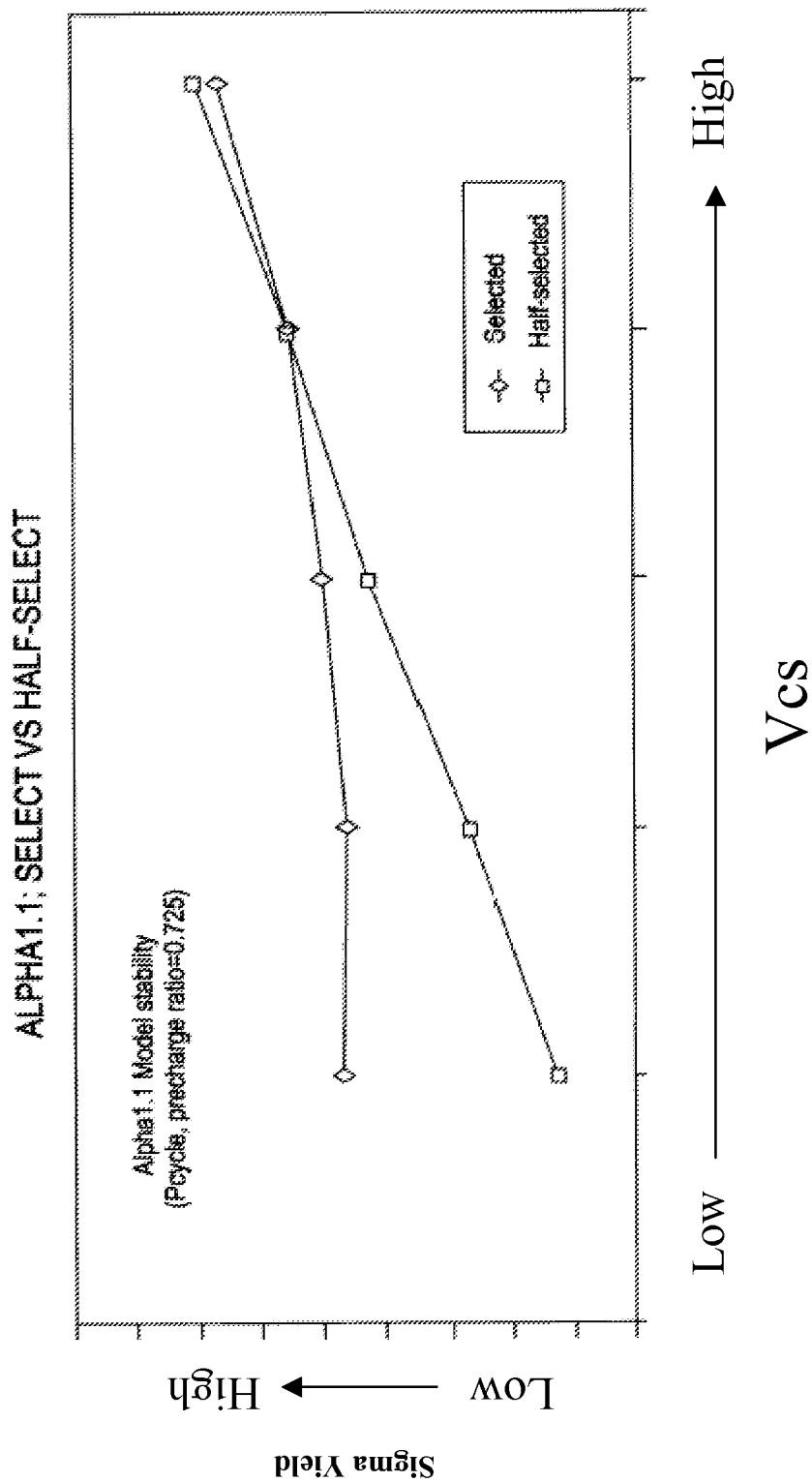
FIG. 12 provides a graphical comparison of Alpha1.1 selected columns and half-selected columns as a function of Sigma yield and Vcs.

FIG. 10 illustrates half-selected stability of Alpha1 and Alpha1.1 as a function of Sigma yield and Vcs. Alpha1.1 represents an updated technology target node. This graph illustrates that, despite the Sigma difference between Alpha1 and Alpha1.1, the optimal precharge multiplier voltage trend is still effective. FIG. 11 provides a graph involving writability of Alpha1 and Alpha1.1 as a function of Vcs for different precharge multipliers. FIG. 12 provides a graph of Alpha1.1 selected columns and half-selected columns as a function of Vcs at a precharge multiplier ratio of 0.725.

Figure 13:
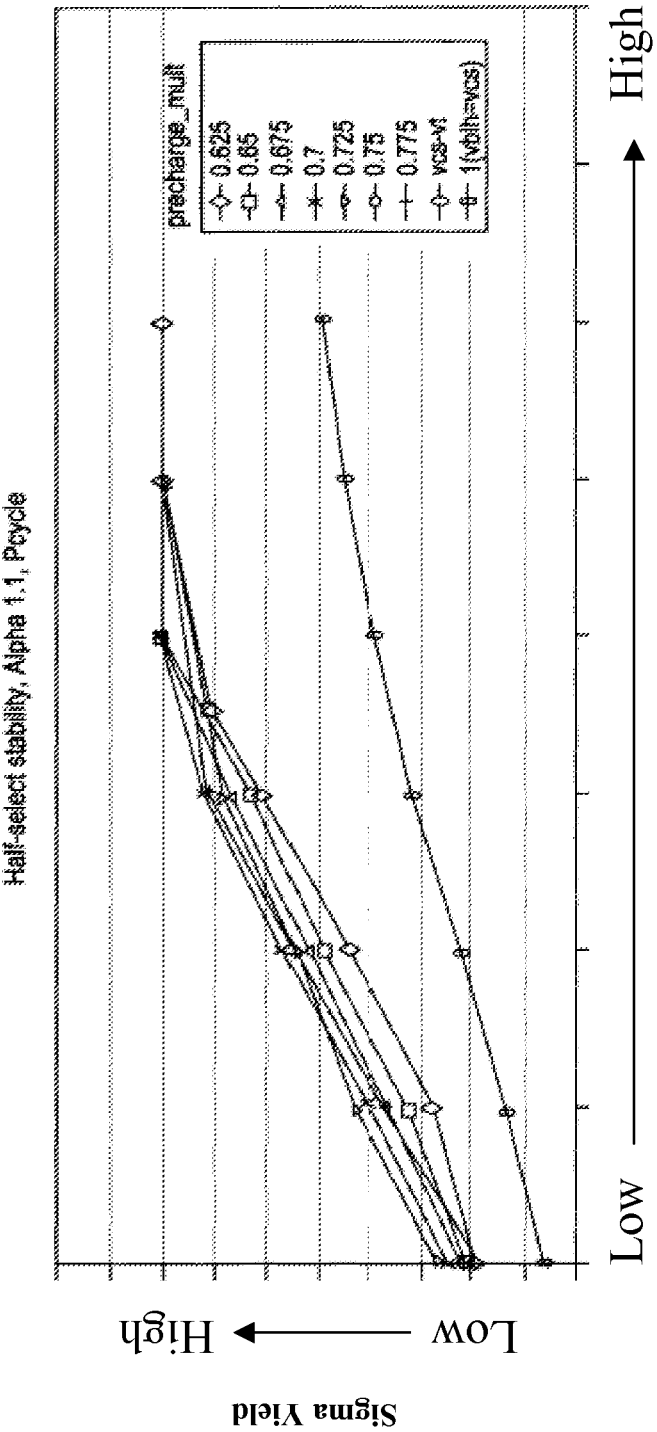
FIG. 13 provides a graph of absolute yield half-selected stability for different precharge multipliers.

FIG. 13 provides a graphical representation of Alpha1.1 absolute yield half-selected stability for different pre-charge multipliers as a function of Vcs. The graph indicates, inter alia, that even at low voltages there is a significant difference in Sigma. Accordingly, the precharge multiplier is extremely important in improving Sigma. In FIG. 13, the 1 (vblh=vcs) line represents a situation where precharge multiplier was not applied to the precharge voltage. As a non-limiting example, FIG. 13 demonstrates that precharge multiplier of 0.7 applied to a Vcs of about 1.1 shows a delta Sigma gain of approximately 2 Sigma. As such, utilizing the precharge multiplier when precharging a memory cell greatly increases the stability of the cell.

Figure 14:
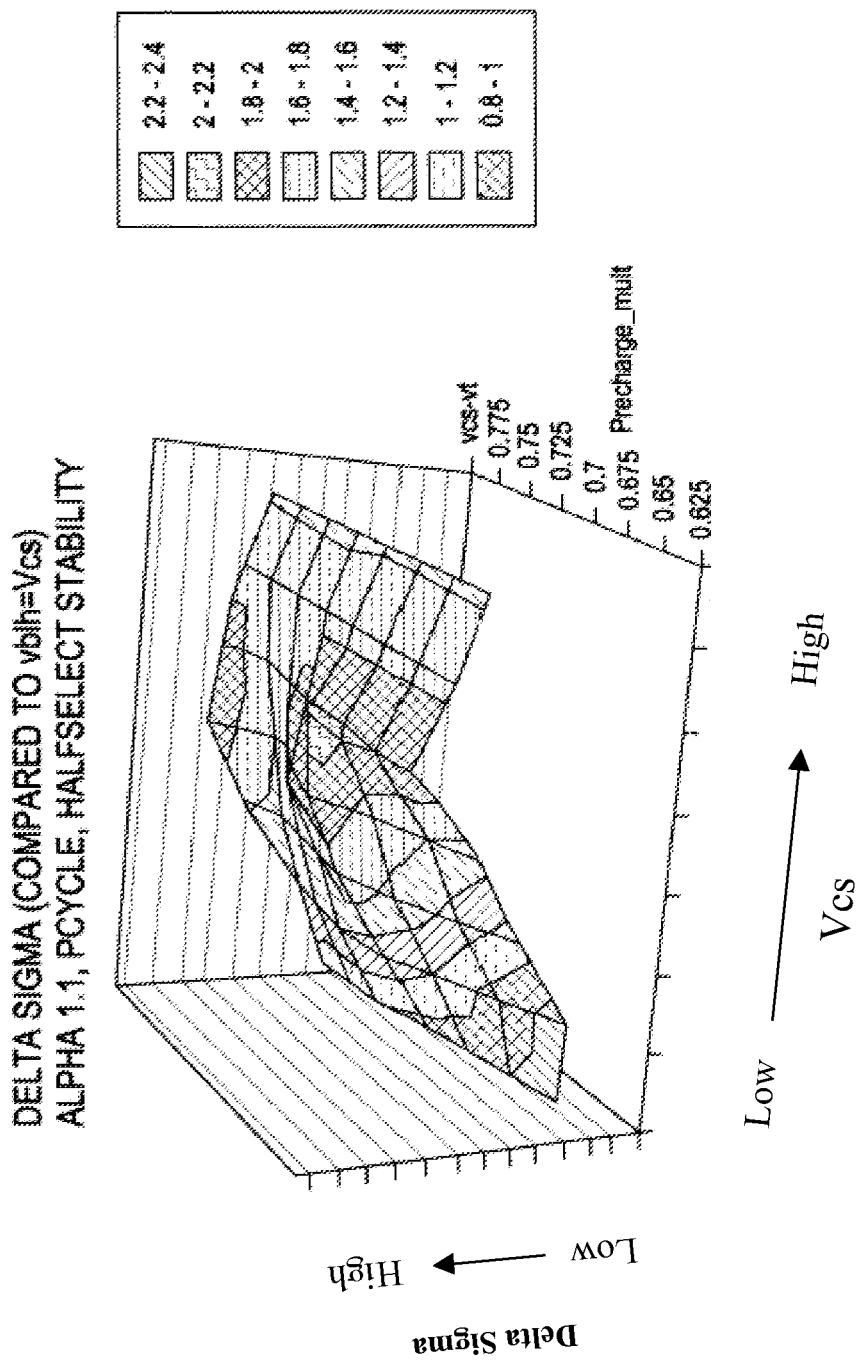
FIG. 14 provides a graph of incremental yield gain for half-selected stability yield for different precharge multipliers over varying Vcs values compared to a reference case having a precharge multiplier of 1 (one).

FIG. 14 provides a graph involving changes in Sigma (i.e., delta Sigma) for various precharge multipliers and Vcs values. More specifically, the graph of FIG. 14 depicts incremental yield gain for half-selected stability yield for different precharge multipliers over varying Vcs values compared to a reference case having a precharge multiplier of 1 (one).

Figure 15:
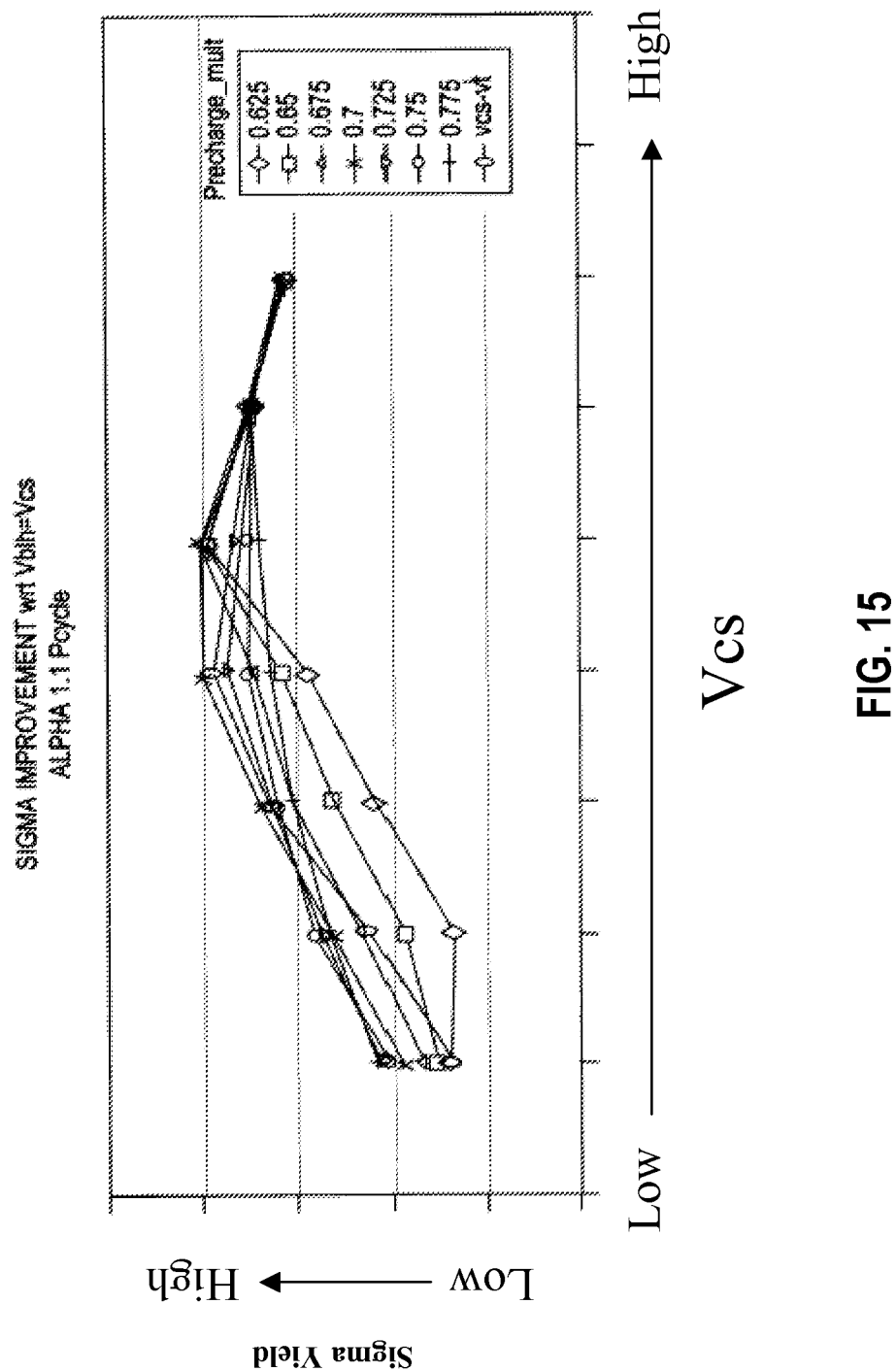
FIG. 15 provides another graph of incremental yield gain for half-selected stability yield for different precharge multipliers over varying Vcs values compared to a reference case having a precharge multiplier of 1 (one).

FIG. 15 provides a graph involving Sigma yield over increasing Vcs values. In the non-limiting example illustrated in FIG. 15, the optimal precharge multiplier is approximately 0.7. Accordingly, embodiments provide that there is an optimal precharge multiplier that may achieve a peak Sigma at a certain Vcs value. The graph of FIG. 15 also depicts incremental yield gain for half-selected stability yield for different precharge multipliers over varying Vcs values compared to a reference case having a precharge multiplier of 1 (one).

Embodiments provide for determining an optimal precharge voltage to maximize memory cell characteristics, including, but not limited to, stability, efficiency, performance, writability, and reliability. In addition, embodiments provide for determining an optimal precharge multiplier which may be utilized to determine the optimal precharge voltage by multiplying the precharge supply voltage by the precharge multiplier. According to embodiments, the precharge supply voltage may be, but is not limited to, Vdd and Vcs. Furthermore, embodiments provide for placing sense amplification and cell assist circuitry at local bit lines instead of at global bit lines. As such, embodiments provide for placing cell assist circuitry and sense amplification circuitry at the sub-memory cell array level. Non-limiting examples of cell assist circuitry include read and write assist circuitry.

Embodiments provide for operation of memory devices in a best mode based on Vcs and Vdd conditioning offering cell characteristics. Accordingly, embodiments provide for minimal memory cell degradation while maintaining circuit functionality and guarding against instability. In addition, embodiments provide a methodology for developing precharge voltage values for bit lines in a memory device. Furthermore, embodiments provide a programmable precharge circuit technique for operating in a broad voltage range and methods for optimizing such a circuit. Moreover, embodiments improve the operating range through programmable precharge methods. Embodiments improve the operating range regardless of whether the bitline supply is similar to the logic or cell supply.

Figure 16:
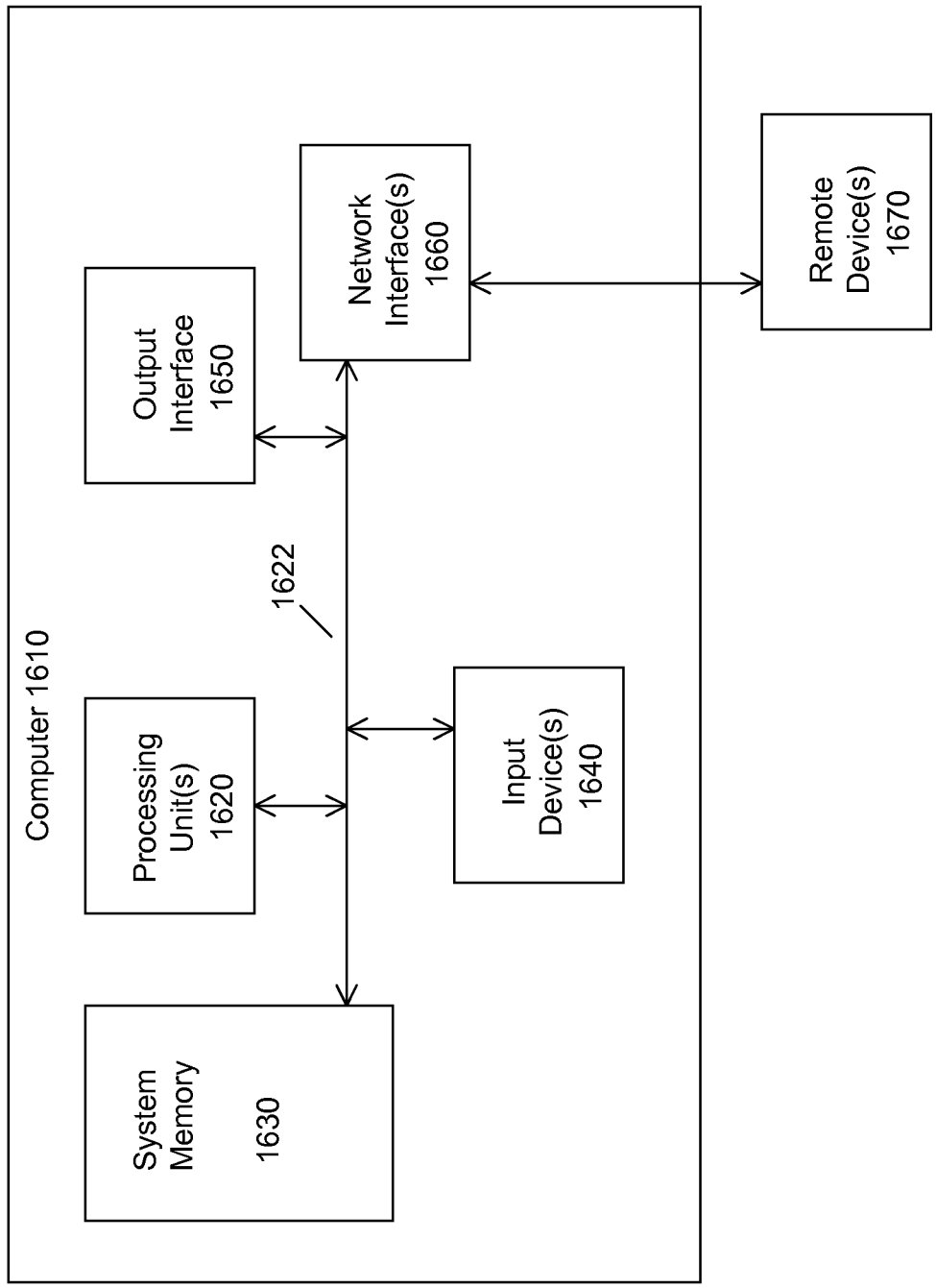
FIG. 16 provides an example computer system.

Referring to FIG. 16, it will be readily understood that certain embodiments can be implemented using any of a wide variety of devices. An example device that may be used in implementing one or more embodiments includes a computing device in the form of a computer 1610. In this regard, the computer 1610 may execute program instructions configured to record computer activities of a user and perform other functionality of the example embodiments, as described herein.

Components of computer 1610 may include, but are not limited to, a processing unit 1620, a system memory 1630, and a system bus 1622 that couples various system components including the system memory 1630 to the processing unit 1620. Computer 1610 may include or have access to a variety of computer readable media. The system memory 1630 may include computer readable storage media in the form of volatile and/or nonvolatile memory such as read only memory (ROM) and/or random access memory (RAM). By way of example, and not limitation, system memory 1630 may also include an OS, application programs, other program modules, and program data.

A user can interface with the computer 1610 (for example, enter commands and information) through input devices 1640. A monitor or other type of device can also be connected to the system bus 1622 via an interface, such as an output interface 1650. In addition to a monitor, computers may also include other peripheral output devices. The computer 1610 may operate in a networked or distributed environment using logical connections to one or more other remote computers or databases, such as databases storing recorded information of one or more recording sessions. The logical connections may include a network, such as a local area network (LAN) or a wide area network (WAN), but may also include other networks/buses.

It should be noted as well that certain embodiments may be implemented as a system, method or computer program product. Accordingly, aspects of the invention may take the form of an entirely hardware embodiment, an entirely software embodiment (including firmware, resident software, microcode, et cetera) or an embodiment combining software and hardware aspects that may all generally be referred to herein as a "circuit," "module" or "system." Furthermore, aspects of the invention may take the form of a computer program product embodied in one or more computer readable medium(s) having computer readable program code embodied therewith.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, et cetera, or any suitable combination of the foregoing.

Computer program code for carrying out operations for aspects of the invention may be written in any combination of one or more programming languages, including an object oriented programming language such as Java™, Smalltalk, C++ or the like and conventional procedural programming languages, such as the "C" programming language or similar programming languages. The program code may execute entirely on the user's computer (device), partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

This disclosure has been presented for purposes of illustration and description but is not intended to be exhaustive or limiting. Many modifications and variations will be apparent to those of ordinary skill in the art. The embodiments were chosen and described in order to explain principles and practical application, and to enable others of ordinary skill in the art to understand the disclosure for various embodiments with various modifications as are suited to the particular use contemplated.

Although illustrative embodiments of the invention have been described herein with reference to the accompanying drawings, it is to be understood that the embodiments of the invention are not limited to those precise embodiments, and that various other changes and modifications may be affected therein by one skilled in the art without departing from the scope or spirit of the disclosure.

What is claimed is:

1. An apparatus comprising:
one or more memory devices having one or more memory cells arranged in rows and columns therein, the one or more memory devices comprising:
one or more wordlines configured to activate one or more rows of memory cells; and
one or more bit lines configured to transfer memory cell data, the one or more bit lines configured to receive a precharge voltage; and
one or more voltage supplies supplying one or more voltages to the one or more memory cells, wherein at least one of the one or more voltage supplies is a precharge voltage source;
wherein the one or more bit lines are precharged with the precharge voltage, the precharge voltage being determined by multiplying a voltage supplied by the precharge voltage source by a precharge multiplier optimized for the one or more memory cells.

2. The apparatus according to claim 1, wherein the one or more memory devices comprise one or more SRAM memory devices.

3. The apparatus according to claim 1, wherein the one or more memory cells further comprise:
one or more read assist circuits; and
one or more sense amplification circuits.

4. The apparatus according to claim 1, wherein the precharge multiplier is determined by one or more analyses of one or more memory device characteristics.

5. The apparatus according to claim 4, wherein the one or more memory device characteristics comprise stability, writability, reliability, efficiency, power, and performance.

6. The apparatus according to claim 5, wherein the one or more memory device characteristics are measured in terms of dynamic/static behavior translated to yield numbers.

7. The apparatus according to claim 5, wherein the precharge multiplier is determined based on optimizing the stability memory device characteristic.

8. The apparatus device according to claim 1, wherein the one or more voltage supplies comprise Vdd and Vcs.

9. The apparatus device according to claim 8, wherein the precharge voltage source is Vcs.

10. The apparatus according to claim 1, wherein precharging the one or more bit lines with the precharge voltage comprises precharging half-selected memory cells and selected memory cells.

11. The apparatus according to claim 1, further comprising:
one or more programmable precharge circuits coupled with the one or more bit lines, the one or more programmable precharge circuits configured to provide the precharge voltage to the one or more bitlines.

12. The apparatus according to claim 11, wherein the one or more programmable precharge circuits comprise one or more analog circuits.

13. The apparatus according to claim 11, wherein the one or more programmable precharge circuits comprise one or more FET transistors.

14. A method comprising:
arranging one or more memory cells in rows and columns within one or more memory devices, the one or more semiconductor memory device comprising:
one or more wordlines configured to activate one or more rows of memory cells; and
one or more bit lines configured to transfer memory cell data, the one or more bit lines configured to receive a precharge voltage; and
supplying the one or more memory cells with one or more voltages through one or more voltage supplies, wherein at least one of the one or more voltage supplies is a precharge voltage source;
wherein the one or more bit lines are precharged with the precharge voltage, the precharge voltage being determined by multiplying a voltage supplied by the precharge voltage source by a precharge multiplier optimized for the one or more memory cells.

15. The method according to claim 14, wherein the one or more memory devices comprise one or more SRAM memory devices.

16. The method according to claim 14, wherein the one or more memory cells further comprise:
one or more read assist circuits; and
one or more sense amplification circuits.

17. The method according to claim 14, wherein the precharge multiplier is determined by one or more analyses of one or more memory device characteristics.

18. The method according to claim 17, wherein the one or more memory device characteristics comprise stability, writability, reliability, efficiency, power, and performance.

19. The method according to claim 18, wherein the one or more memory device characteristics are measured in terms dynamic/static behavior translated to yield numbers.

20. The method according to claim 18, wherein the precharge multiplier is determined based on optimizing the stability memory device characteristic.

21. The method according to claim 14, wherein the one or more voltage supplies comprise Vdd and Vcs.

22. The method according to claim 21, wherein the precharge voltage source is Vcs.

23. The method according to claim 14, further comprising:
one or more programmable precharge circuits coupled with the one or more bit lines, the one or more programmable precharge circuits configured to provide the precharge voltage to the one or more bitlines.

24. The method according to claim 23, wherein the one or more programmable precharge circuits comprise one or more FET transistors.

25. Ant apparatus comprising:
one or more memory devices having one or more memory cells arranged in rows and columns therein, the one or more memory devices comprising:
  one or more wordlines configured to activate one or more rows of memory cells; and
  one or more bit lines configured to transfer memory cell data, the one or more bit lines comprising one or more local bit lines and one or more global bit lines;
  one or more circuit assist circuits; and
  one or more sense amplification circuits;
wherein the one or more bit lines are precharged with a precharge voltage determined by multiplying a voltage supplied by the precharge voltage source by a precharge multiplier optimized for the one or more memory cells;
wherein the one or more sense amplification circuits and the one or more circuit assist circuits are operably coupled to the one or more local bit lines.

* * * * *